(12) United States Patent
McBride

(10) Patent No.: US 6,321,365 B1
(45) Date of Patent: Nov. 20, 2001

(54) SYSTEM AND METHOD FOR DETECTING STORAGE NODES THAT ARE SUSCEPTIBLE TO CHARGE SHARING

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/236,893

(22) Filed: Jan. 26, 1999

(51) Int. Cl.$^7$ .................................................. C06F 17/00
(52) U.S. Cl. ............................................. 716/5; 703/14
(58) Field of Search .................................. 703/1, 14, 16; 706/47; 714/33; 716/1, 5, 11

(56) References Cited

U.S. PATENT DOCUMENTS

| | | | | |
|---|---|---|---|---|
| 5,202,841 | * | 4/1993 | Tani | 716/5 |
| 5,345,401 | * | 9/1994 | Tani | 703/16 |
| 5,553,008 | * | 9/1996 | Huang et al. | 703/14 |
| 5,712,794 | * | 1/1998 | Hong | 703/14 |
| 5,734,798 | * | 3/1998 | Allred | 706/47 |
| 5,987,237 | * | 11/1999 | McBride | 703/1 |
| 6,128,768 | * | 10/2000 | Ho | 716/5 |

OTHER PUBLICATIONS

"Transient Pass–Transistor Leakage Current in SOI MOS-FET's," Assaderaghi et al., IEEE Electronic Device Letters, vol. 18, No. 6. Jun. 1997.*

* cited by examiner

Primary Examiner—Matthew Smith
Assistant Examiner—Walter Benson

(57) ABSTRACT

The present invention is generally directed to a system and method for identifying a storage node that is susceptible to charge sharing by another node. In accordance with one aspect of the invention, a method identifies storage nodes susceptible to charge sharing by first identifying, from a netlist, a storage node. For a given storage node, the method determines whether any pass FET devices are being driven by the storage node. For any such pass FET devices, the method retrieves a capacitance value for both sides of the pass FET devices being driven by the storage node. Specifically, a first capacitance value is retrieved for the storage node side of each pass FET device, and a second capacitance value is retrieved for a node on the opposite side of each pass FET device. Then the method calculates a ratio between the first and second capacitance values for each pass FET device being driven by the storage node. Finally, the method compares this ratio to a predetermined value, and generates a warning message if the ratio is greater than the predetermined value No.

18 Claims, 7 Drawing Sheets

SYSTEM AND METHOD FOR DETECTING STORAGE NODES THAT ARE SUSCEPTIBLE TO CHARGE SHARING

BACKGROUND OF THE INVENTION

1. Field of the Invention

The present invention generally relates to computer-aided circuit design systems, and more particularly to a system and method for evaluating a netlist of an integrated circuit to detect storage nodes that are susceptible to charge sharing.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is often a need to identify combinations of gates that are configured in such a manner that may lead to operational uncertainty or performance problems. By way of particular example, it is sometimes desirable to ensure that the circuit components are not configured in a manner that would lead to charge sharing problems.

As is known, "charge sharing" is a phenomenon which occurs after a storage node has been written (charged) with its value. Essentially, the node acts as a storage capacitance. After the storage node has been written, if it drives, for example, a pass FET, the charge on the storage node may be "shared" with other nodes, when the pass FET is enabled. As a result, the charge on the storage node may be substantially diminished and thereby cause the storage node to convey erroneous results or otherwise malfunction.

Accordingly, there is a heretofore unaddressed need to provide a design tool that evaluates a netlist or other electronic file representative of an electronic circuit to identify circuit configurations that may result in undesirable charge sharing effects.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying a storage node that is susceptible to charge sharing by another node. In accordance with one aspect of the invention, a method identifies storage nodes susceptible to charge sharing by first identifying, from a netlist, a storage node. For a given storage node, the method determines whether any pass FET devices are being driven by the storage node. For any such pass FET devices, the method retrieves a capacitance value for both sides of the pass FET devices being driven by the storage node. Specifically, a first capacitance value is retrieved for the storage node side of each pass FET device, and a second capacitance value is retrieved for a node on the opposite side of each pass FET device. Then the method calculates a ratio between the first and second capacitance values for each pass FET device being driven by the storage node. Finally, the method compares this ratio to a predetermined value, and generates a warning message if the ratio is greater than the predetermined value.

In accordance with another aspect of the present invention, a system for identifying a storage node that is susceptible to charge sharing by another node. The system includes means for identifying a storage node from a netlist. The system further includes means for identifying all pass FET devices that are being driven by the storage node. The system also includes means for obtaining both a first and second capacitance values, wherein the first capacitance value represents a parasitic capacitance for the storage node, and the second capacitance value represents a parasitic capacitance of a channel node of each pass FET device opposite the storage node. The system further includes means for calculating a ratio between the first and second capacitance values for each pass FET device being driven by the storage node. Finally, the system includes means for generating a warning message if the ratio is greater than a predetermined number.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
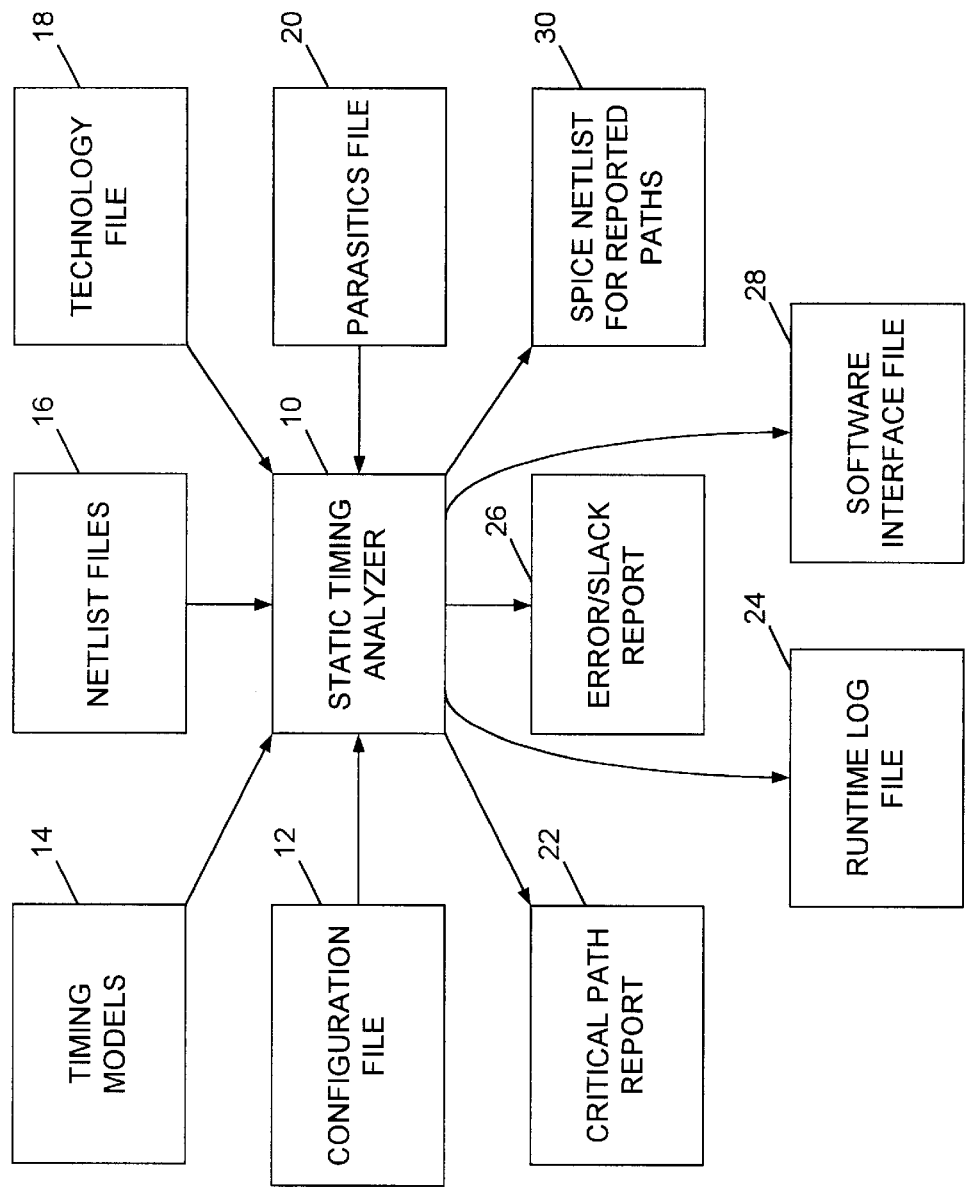
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations. The static timing analyzer 10 may make its internal database or netlist available to the electrical rules checker, which may generate a binary file output 106.

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion 102 of the electrical rules checker program 100 of the preferred embodiment of the present invention operates to identify pass gates within an integrated circuit design.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
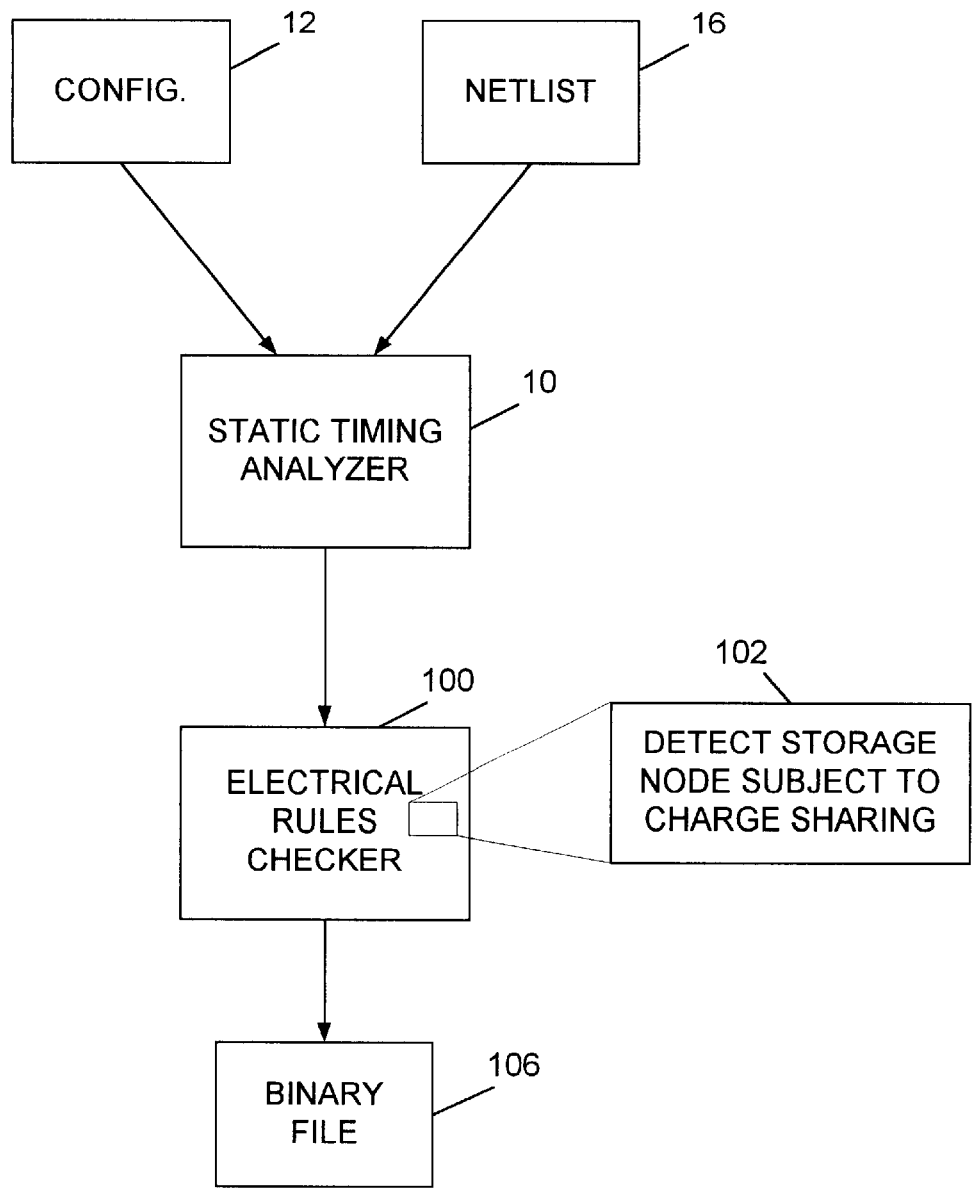
FIG. 2 is a block diagram illustrating the orientation of the electrical rules checking method of the present invention, in relation to an existing static timing analyzer.

In keeping with the description of FIG. 2, the electrical rules checker 100 of the present invention may generate an output binary file 106, which may ultimately be used in subsequent executions of the electrical rules checker program 100.

Figure 3:
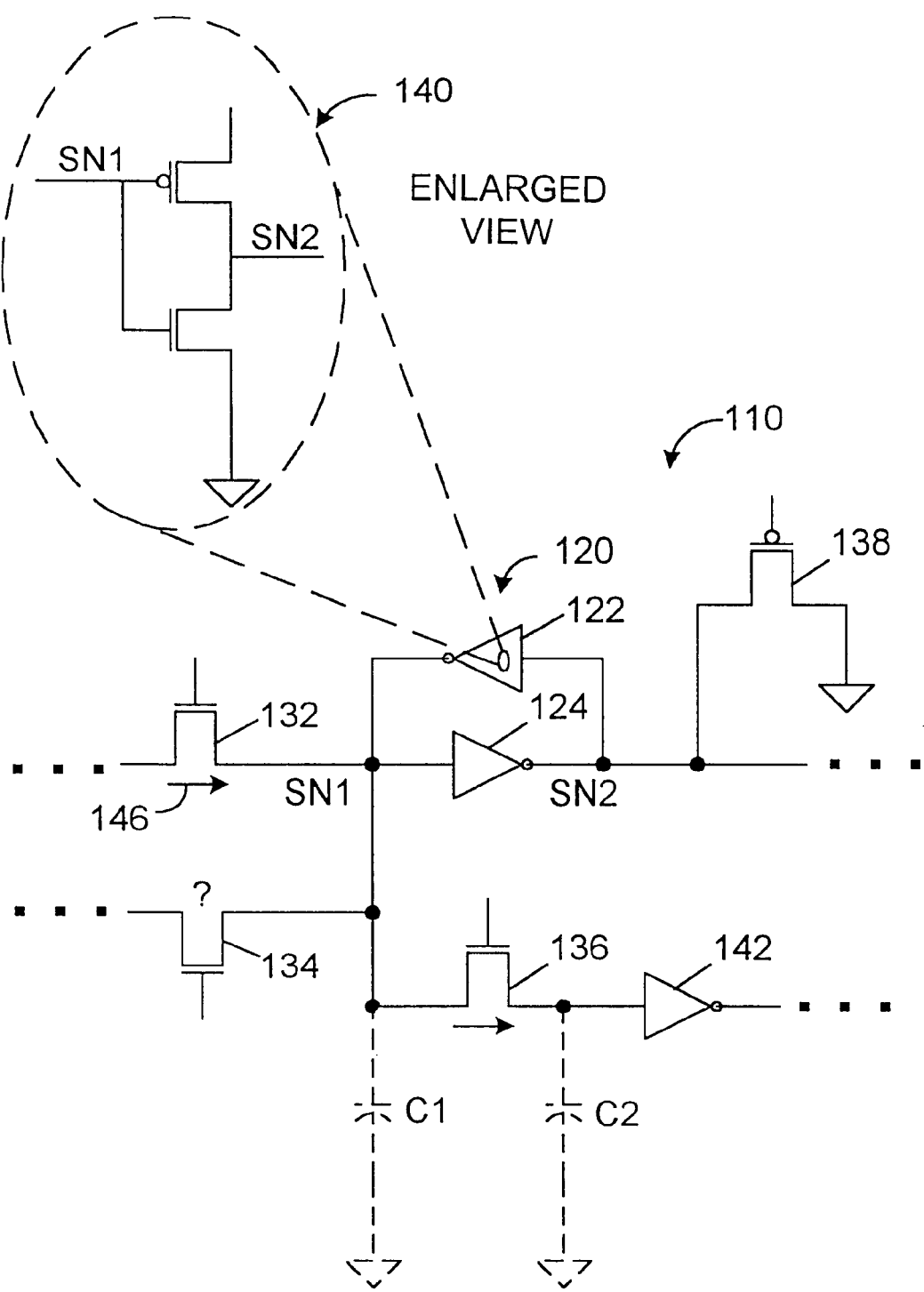
FIG. 3 is a schematic diagram of a portion of an integrated circuit having a storage node and a plurality of pass FETs that are identified and evaluated in accordance with the invention.

Having described certain environmental and other background system information, the discussion will now be directed toward the inventive aspects of the present invention. In this regard, one aspect of the present invention is to provide a method for detecting storage nodes that may be susceptible to the adverse effects resulting from charge sharing phenomenon. Referring to FIG. 3, a circuit portion 110 is depicted having a latch 120 surrounded by various FETs 132, 134, 136, and 138. As is known, the latch 120 comprises a pair of inverter elements 122 and 124 connected in a circuitous configuration. The inverters 122 and 124 have been illustrated with their logic schematic symbols, rather than at the transistor level. However, and as is known, each inverter element 122 and 124 may be readily constructed from a pair of FET transistors (as illustrated at 140).

By way of illustration, if NFET 132 drives the value at storage node 1 (SN1) to a logic low, then the inverter 124 will drive the value at storage node 2 (SN2) to a logic high. The value SN1 will remain a logic low, even if NFET 132 turns off, by virtue of inverter 122. Specifically, inverter 122 will drive the value of SN1 low, by inverting its logic high input provided at SN2. In this way, the circuitous configuration of the inverter elements 122 and 124 create a memory element that preserves the values at SN1 and SN2 until one of these nodes is driven to another value by an external device.

In accordance with the concepts and teachings of the present invention, a system and method are provided for determining whether a storage node SN1 or SN2 are subject to adverse effects resulting from charge sharing. As will be further described below, the only FET device in FIG. 3 that raises an issue or concern in this regard is NFET 136. Specifically, adverse consequences of charge sharing phenomenon are deemed to affect only pass FET devices that are driven by a storage node of a latch element 120. Therefore, in accordance with the invention, the elements surrounding each of the storage nodes SN1 and SN2 are evaluated to determine several things, including whether they drive either of the storage nodes SN1 and SN2 or whether they are driven by the storage nodes SN1 or SN2, and whether or not the devices are pass FETs.

Simply defined, and for purposes of the present invention, a pass FET is a FET device that connects the output of one node to the input of another node across the channel nodes of the FET device. Using this definition, NFET 136 is recognized by the invention as a pass FET because it connects the output of NFET 132 (as well as the output of inverter 122) to the input of inverter 142, across its channel nodes (source and drain nodes). PFET 138 is not recognized as a pass FET, because its source node is directly connected to ground. In this regard, and for purposes of the present invention, a FET device having its source node connected to either VDD or ground is not deemed to be a pass FET device. NFETs 132 and 134, like NFET 136, are deemed to be pass FET devices, unless their channel nodes opposite SN1 are connected to either VDD or ground. Since SN1 is connected to both a gate input and a gate output (e.g., inverters 122 and 124) if the opposite channel node of NFETs 132 and 134 is connected to either a gate input or a gate output, then these devices will satisfy the definition of a pass FET device.

However, NFETs 132 and 134, although recognized as pass FET devices, are not devices that will be evaluated for charge sharing effects, in accordance with the invention. In this regard, and as denoted by the arrowheads (e.g. 146), NFET 132 is configured to drive SN1, as opposed to being driven by SN1. The system and method of the present invention are concerned only with the charge sharing effect of SN1 and SN2, which will only effect devices that are driven by the storage nodes. As described earlier, the charge sharing phenomenon may occur when a storage node is triggered to share its charge with other nodes, as by enabling a pass FET that is series connected to the storage node. The precharge is that charge which may be accumulated at a storage node, such as SN1 or SN2. Since NFET 132 is configured to drive SN1, the charge accumulated at SN1 will not be shared with the channel node of NFET 132 opposite SN1.

In accordance with the system and method of the present invention, the direction of element 132 can be readily ascertained. In this regard, each element in a netlist has certain defining values in a data structure. In accordance with the preferred embodiment, the netlist output from path PathMill (the static timing analyzer) defines circuit elements with a number of characteristics, including a plurality of direction flags. Specifically, there are four direction flags, one of which is set to reflect the direction of a particular device. The direction flags include a source-to-drain direction flag, which is set if a FET is conducting from the source to the drain channel nodes. Another direction flag includes a drain-to-source direction flag, which is set if a FET device is conducting from the drain node to the source node. A third direction flag is set if the element is configured to be bidirectional. Finally, a fourth direction flag is set to specifically indicate that the conducting direction of the device is unset. In this regard, no direction arrows are associated with device 134, but rather a question mark is shown in the figure to represent that the direction of the device is unset. In the operation of the preferred embodiment, the method of the present invention identifies NFET 134 as a pass FET without having its direction attribute set, and the system may generate a warning message to this effect, but the device will not be further analyzed for purposes of charge sharing.

Accordingly, by process of elimination, that leaves only pass FET 136 to be of concern to the system and method of the present invention. For this device, the direction of NFET 136 is set to be conducting away from SN1. Recognizing pass FET 136 to be a device of concern, the present invention then evaluates the capacitance associated with both of its channel nodes. A first capacitance C1 is associated with the channel node of NFET 136 that is the same as the storage node SN1. A second capacitance C2 is associated with the channel node of device 136, opposite the storage node SN1. These capacitance values may be readily obtained from PathMill, or other comparable program. Alternatively, these values may be calculated separately by the system and method of the present invention. The capacitance values have been illustrated as capacitors, using dashed lines. It should be appreciated that the capacitance values C1 and C2 are not values of actual capacitor devices, but rather are representative of parasitic capacitances that are associated with the circuit components that comprise the circuit 110.

After obtaining the capacitance values C1 and C2, the method of the present invention computes a ratio between the two (e.g., C2/C1). If this ratio exceeds a predetermined value, then the method of the present invention may present a warning message to a user that a potential charge sharing affect could result at pass FET 136. The circuit designer may then evaluate this portion of the circuit design to determine whether an alternative design should be implemented. It will be appreciated, that the predetermined value of the ratio between capacitance of C1 and C2 may vary from design to design, depending upon a number of factors. Generally, it is desirable to have the capacitance C1 to be greater than the capacitance of C2.

It will be appreciated that the circuit illustrated in FIG. 3 has been presented merely for purposes of illustration, to gain a better understanding of the system and method of the present invention, and that the concepts in teachings provided herein apply equally to a wide variety of circuit configurations. In this regard, reference is now made to FIG. 4, which is a flow chart 150 illustrating the top level operation of a method constructed in accordance with the present invention. In accordance with a first step, the method determines whether a node is a storage node or other type of node. In this regard, in accordance with the preferred embodiment of the present invention, the method operates upon a netlist file (e.g., a netlist file generated by PathMill) by traversing the entire netlist, evaluating each node of the netlist. Consistent with the invention, the method may determine that a given node is a storage node in various ways. One manner of determining whether a node is a storage node is by determining or identifying latch elements. PathMill will, in fact, identify latch elements, whereby the present invention may readily identify storage nodes. In this regard, each latch element defines two storage nodes, as both nodes of a latch element (e.g., SN1 and SN2 of FIG. 3) are storage nodes.

Thereafter, the method of the invention will identify all pass FET devices that are channel connected to the storage node. In practice, once a latch element has been identified, the present invention will perform the various steps on each of the storage nodes. For brevity herein, however, the steps are recited in connection with only one of the storage nodes. After identifying the pass FET devices that are channel connected to the storage node, the present invention identifies only those pass FETs that are driven by the storage node (step 156). This step is performed in the preferred embodiment by evaluating the direction of the pass FET devices, by evaluating the direction flags that are associated with the device element data structure as described above.

The method then obtains capacitance values for the storage node, as well as the channel node of the pass FET device that is opposite the storage node (step 157). The method then calculates a capacitance ratio between the two capacitance values (step 158). Finally, the method determines whether this computed ratio exceeds a predetermined value (step 159). If so, the method may generate a warning message to alert the designer that a particular storage node is subject to adverse effects of charge sharing through a particular pass FET device. The designer may then take a closer look at this area of the circuit to determine if in fact there is a problem and/or implement an alternative design.

Figure 5A:
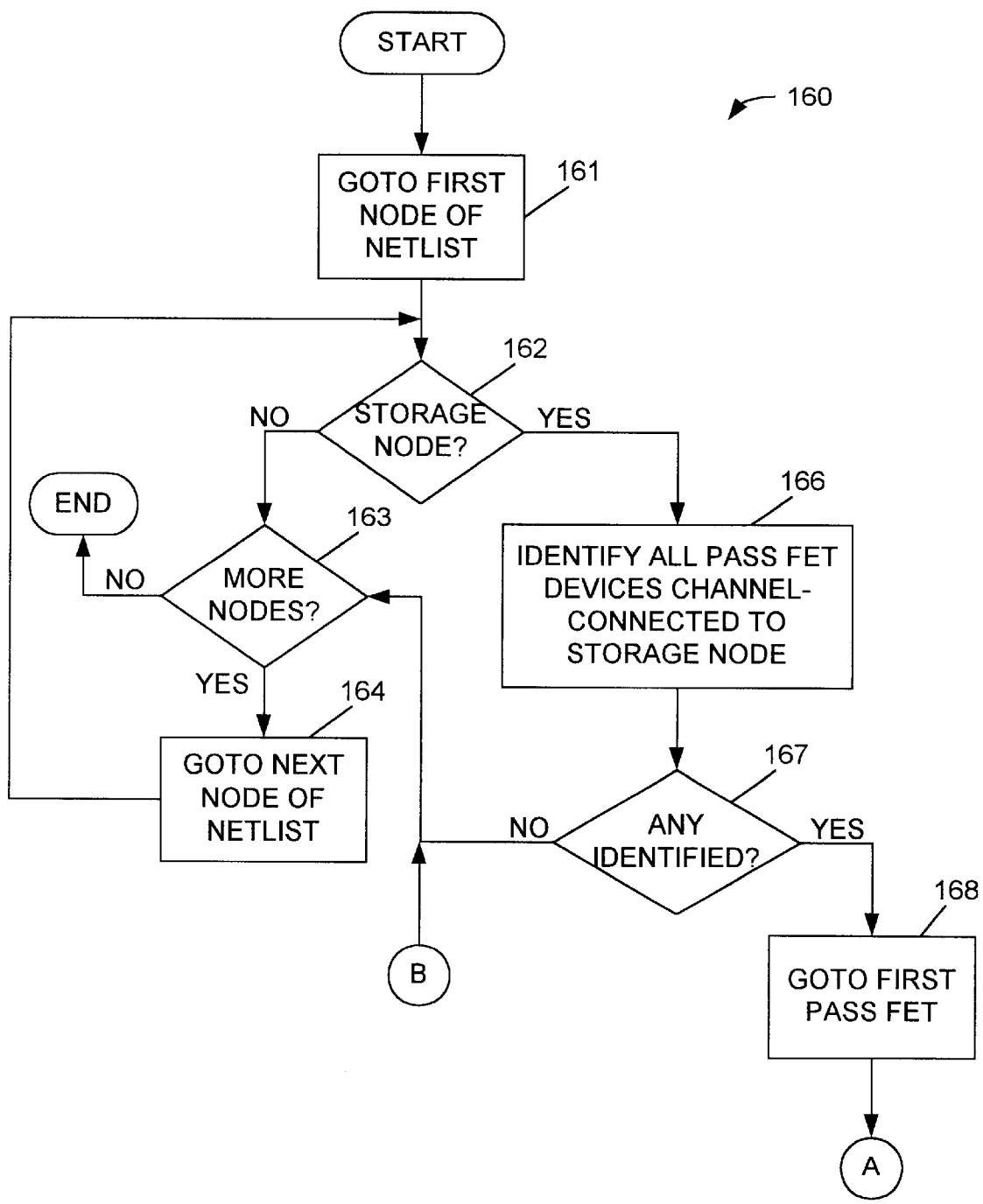
FIGS. 5A and 5B, collectively, comprise a flowchart illustrating the method of the preferred embodiment of the present invention.
Figure 5B:
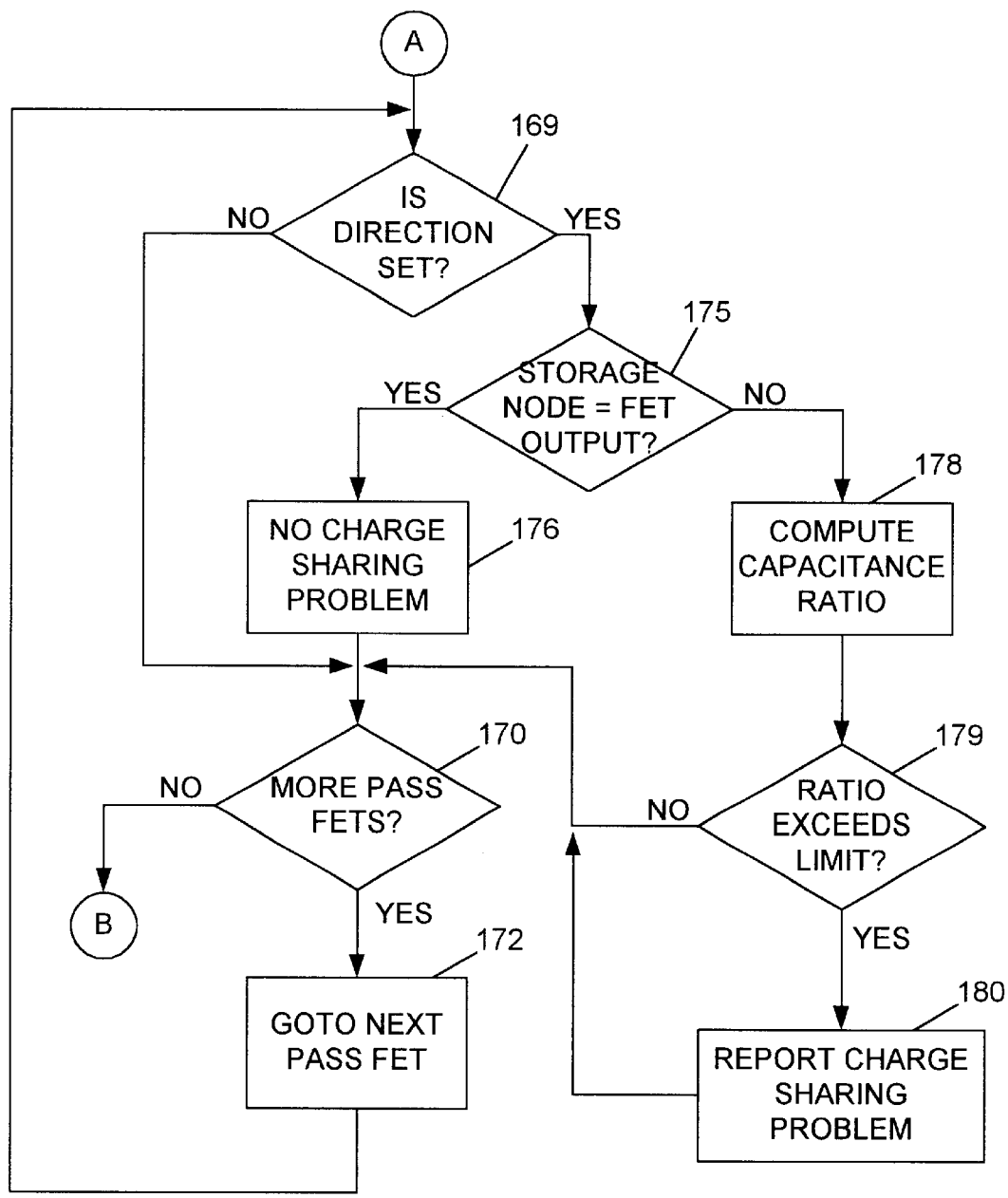

Having set forth the principal steps of the preferred embodiment, reference is now made to FIGS. 5A and 5B, collectively, which comprise a flow chart 160 that illustrates in more detail the method of the preferred embodiment of the present invention. As previously described, the method of the present invention operates by evaluating each node of a netlist file. Accordingly, the method begins by evaluating a first node (step 161) of a netlist. At step 162, the method determines whether the given node is a storage node or some other type of node. As described above, there are various ways of implementing this step, one of which may be to determine whether the node is associated with a latch element (which may be defined in the netlist). If the current node is not a storage node, then the method determines whether there are any additional nodes in the netlist (step 163). If not, then the method of the present invention is complete. If, however, there are additional nodes in the netlist, then the method proceeds to the next node (step 164) and again returns to step 162 to evaluate whether that node is a storage node.

If a given node (at step 162) is evaluated to be a storage node, then the present invention evaluates each element connected to that node, one by one, to determine all devices or elements that are pass FET devices, which are channel-connected to the storage node (step 166). As described above, this step looks for FET devices that are channel connected to the storage node and which are connected to either an input or output of another gate. Accordingly, this step eliminates any FET devices wherein the gate node is connected to the storage node currently being evaluated. It also eliminates any FET devices that are channel-connected to the storage node of interest, wherein the opposite channel node is connected to either VDD or ground. The method may then determine whether any such pass FET devices were identified (step 167). If not, the method may return to step 163 as illustrated. If, however, any such pass FET devices were identified, then the method may evaluate each one, one by one, in accordance with the steps that follow.

Specifically, the method may proceed to evaluate the first pass FET device (step 168). The method evaluates this pass FET to determine whether its direction is set (step 169). If not, then the method evaluates whether there are any more pass FETs that are channel connected to the current storage node (step 170). If not, then the present invention returns to step 163 to determine whether there are more nodes in the netlist to be evaluated. If, however, there are additional pass FETs that are connected to the current storage node, then the method proceeds to the next pass FET device (step 172) and then returns to the evaluation stated at step 169.

If the evaluation at step 169 determines that the device direction is set, then the method proceeds to step 175, where it determines whether the storage node is the FET output or input. It may make this determination may evaluating the direction flag of the pass FET element. Specifically, if the storage node is directly connected to the FET drain node, then the storage node is an output if the source-to-drain direction flag is set. If, however, the drain-to-source direction flag is set, then step 175 resolves to NO. Thus, if step 175 determines that the storage node is connected to the FET output, then it concludes that this particular FET device will create no potential for a charge sharing problem (step 176), whereby the method may return to step 170 to determine whether there are any additional pass FET devices, previously described.

If, however, at step 175 the method determines that the storage is connected to the FET input, then the method computes a capacitance ratio (step 178). As previously described, this step involves obtaining the capacitance values for both the storage node in question, as well as the channel node of the pass FET device opposite the storage node. These capacitance values may be obtained directly from PathMill or other comparable static analyzing software package, or alternatively may be separately calculated by the present invention. After obtaining the capacitance values, then a first capacitance value may be divided by the second capacitance value to obtain a ratio. The method then compares this ratio to a predetermined number or limit (step 179). If the ratio (C2/C1) exceeds the predetermined limit, then the method reports that the particular storage node may present a charge sharing problem through the particular pass FET device (step 180). Thereafter, the system returns to step 170 to determine whether any additional pass FETs are channel connected to the storage node.

Figure 4:
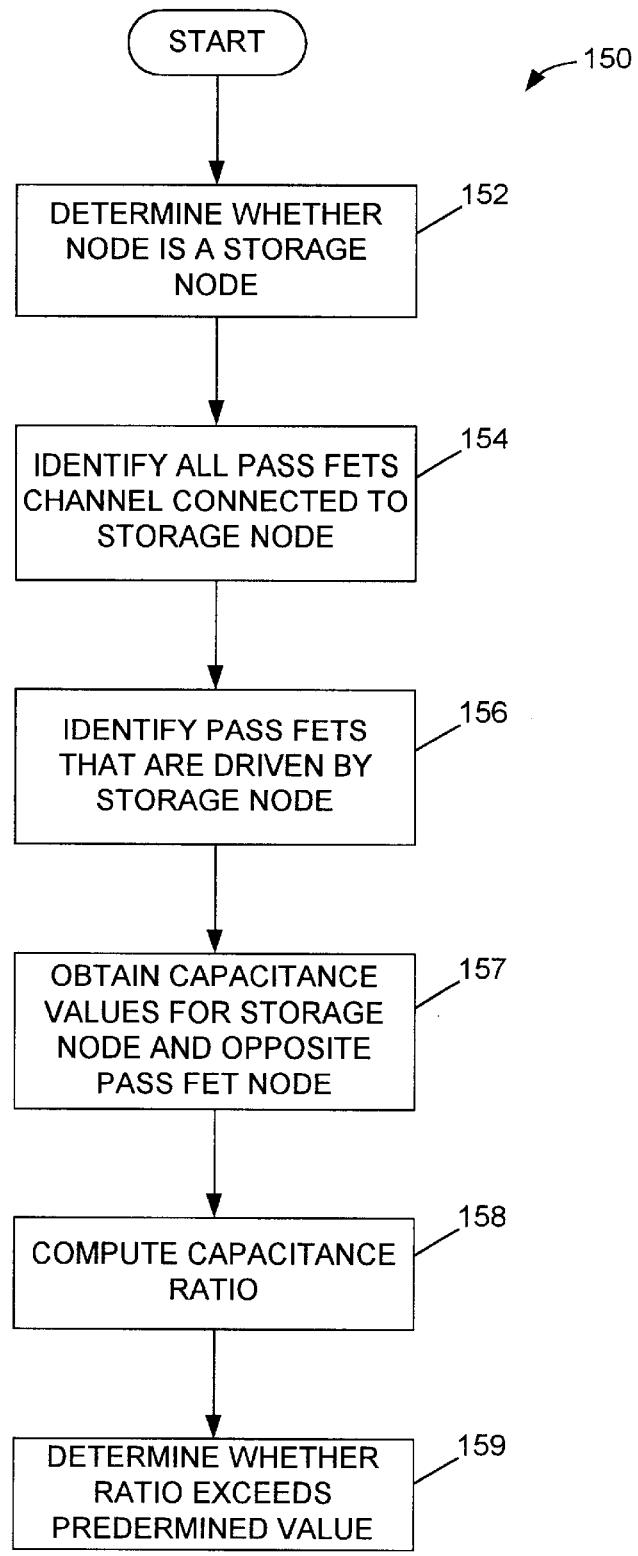
FIG. 4 is a flowchart illustrating the principal steps of a method constructed in accordance with the invention.
Figure 6:
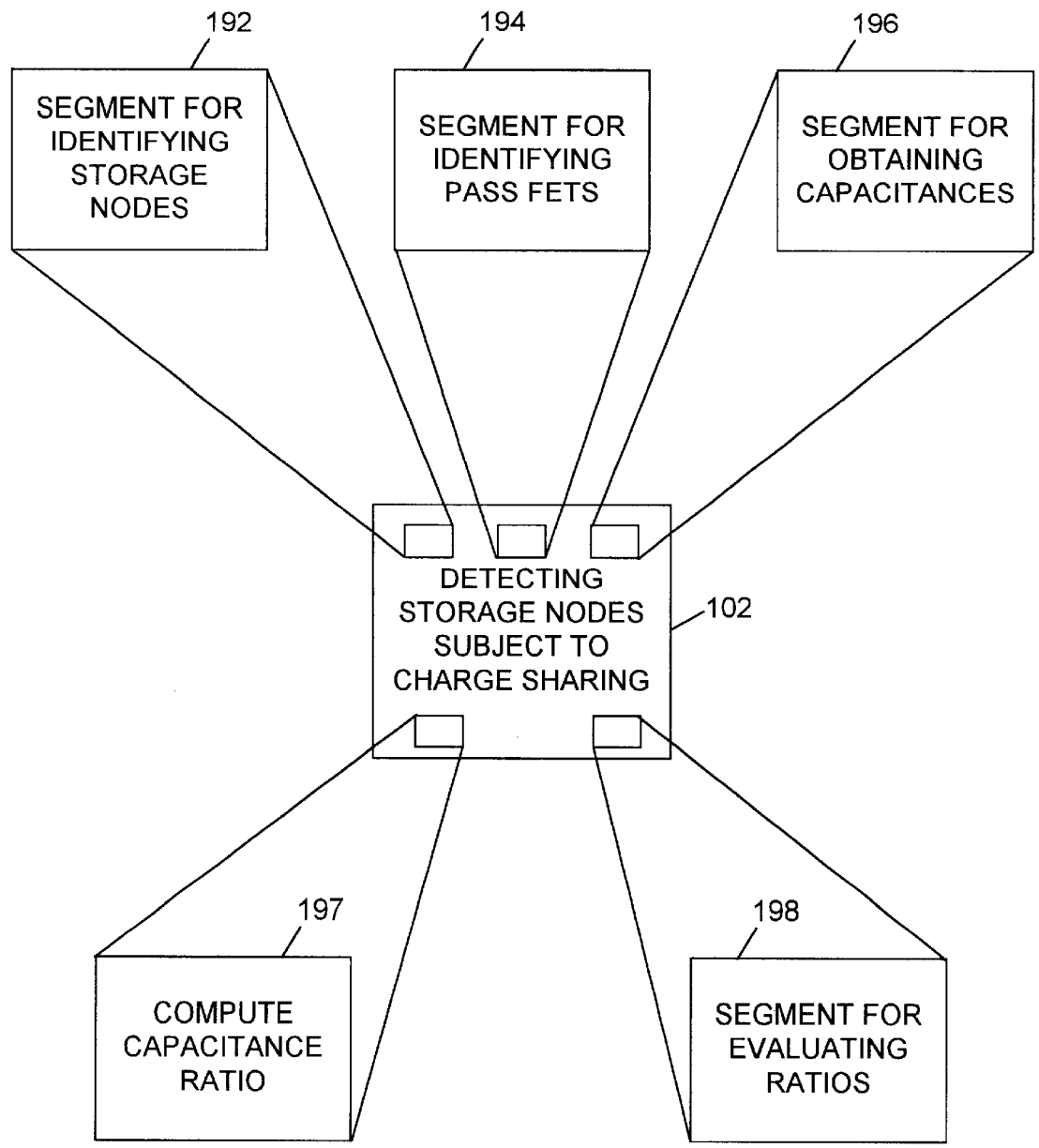
FIG. 6 is a block diagram illustrating certain fundamental code segments comprising a system constructed in accordance with the invention.

It will be appreciated that the steps illustrated in the flow charts of FIGS. 4, 5A, and 5B are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to detect storage nodes that are subject to charge sharing. In accordance with this broad aspect of the present invention, a system may be provided for detecting such storage nodes. In the preferred embodiment, the system comprises software which may be provided on a computer readable storage medium in the form of code segments that are particularly configured to perform various functions. In this regard, reference is now made to FIG. 6 which illustrates certain functions which may be carried out by a system constructed in accordance with the teachings of the invention. For example, the code segment 102 may comprise a plurality of smaller code segments, including a segment for identifying storage nodes 192. Another segment 194 may be provided for identifying pass FETs that are channel connected to a given storage node. Yet another segment 196 may be provided for obtaining the capacitance values on channel nodes of pass FET devices that are channel connected to the storage nodes. Yet another segment 197 may be provided for computing capacitance ratios of the capacitance values obtain in segment 196. Still another segment 198 may be providing evaluating the capacitance calculated in segment 197, to determine whether they exceed a predefined ratio. Yet additional segments (not illustrated) may be provided in connection with the system of the present invention, as will be appreciated by persons of skill in the art in light of the teachings provided herein.

It should be appreciated that the flow charts of FIGS. 4, 5A, and 5B show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 4, 5A, and 5B. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying a storage node that is susceptible to charge sharing by another node comprising the steps of:

identifying, from a netlist, a storage node;

determining whether any pass FET devices are being driven by the storage node;

retrieving a capacitance value for both sides of the pass FET devices being driven by the storage node, wherein a first capacitance value is retrieved for the storage node side of the pass FET devices and a second capacitance value is retrieved for a node on the opposite side of each pass FET device;

calculating a ratio between the first and second capacitance values for each pass FET device being driven by the storage node; and generating a warning message if the ratio is greater than a predetermined number.

2. The method as defined in claim 1, wherein the step of identifying a storage node includes the step of identifying a latch element.

3. The method as defined in claim 2, wherein the latch element comprises two storage nodes, and the step of identifying a storage node selects one of the two storage nodes of the latch element.

4. The method as defined in claim 1, wherein the step of determining whether any pass FET devices are being driven by the storage node, includes the step of identifying all pass FET devices that are channel-connected to the storage node.

5. The method as defined in claim 4, further including the step of evaluating a "direction" parameter of each pass FET device to identify which pass FET devices are driven by the storage node.

6. The method as defined in claim 1, wherein the step of retrieving a capacitance value for both sides of the pass FET devices, includes retrieving the capacitance values from a data structure provided by static timing analysis software.

7. The method as defined in claim 1, wherein the step of retrieving a capacitance value for both sides of the pass FET devices, includes calculating the capacitance values based upon circuit information provided in the netlist.

8. The method as defined in claim 1, wherein all storage nodes susceptible to charge sharing are determined, by performing the method steps on all nodes in the netlist.

9. A method for identifying a storage node of an integrated circuit that is susceptible to charge sharing by another node, comprising the steps of:

identifying the node as a storage node;

evaluating all devices connected to storage node and identifying at least one pass FET device that is channel-connected to the storage node;

determining that the at least one pass FET device is being driven by the storage node;

obtaining a first capacitance value for the storage node;

obtaining a second capacitance value for a channel node on the pass FET device opposite the storage node;

calculating a ratio between the first capacitance value and the second capacitance value; and generating a warning message if the ratio exceeds a predetermined number.

10. The method as defined in claim 9, wherein if any of steps fails, then the node is not a storage node susceptible to charge sharing by another node.

11. A system for identifying a storage node that is susceptible to charge sharing by another node comprising:

means for identifying a storage node from a netlist;

means for identifying all pass FET devices that are being driven by the storage node;

means for obtaining a first capacitance value for the storage node;

means for obtaining a second capacitance value for each pass FET device that is being driven by the storage node, the second capacitance being the capacitance value of a channel node of each pass FET device opposite the storage node;

means for calculating a ratio between the first and second capacitance values for each pass FET device being driven by the storage node; and means for generating a warning message if the ratio is greater than a predetermined number.

12. The system as defined in claim 11, wherein the system comprises a computer readable storage medium, and each of the means elements comprises a segment of code stored on the computer readable storage medium.

13. The system as defined in claim 11, wherein the means for identifying a storage node includes the means for identifying a latch element.

14. The system as defined in claim 13, wherein the latch element comprises two storage nodes, and the means for identifying a storage node selects one of the two storage nodes of the latch element.

15. The system as defined in claim 11, wherein the means for determining whether any pass FET devices are being driven by the storage node, includes means for identifying all pass FET devices that are channel-connected to the storage node.

16. The system as defined in claim 15, further including means for evaluating a "direction" parameter of each pass FET device to identify which pass FET devices are driven by the storage node.

17. The system as defined in claim 11, wherein the means for obtaining the first and second capacitance values, includes means for retrieving the capacitance values from a data structure provided by static timing analysis software.

18. The system as defined in claim 11, wherein the means for obtaining the first and second capacitance values, includes calculating the capacitance values based upon circuit information provided in the netlist.

* * * * *